(12) United States Patent
Little et al.

(10) Patent No.: US 9,678,162 B2
(45) Date of Patent: Jun. 13, 2017

(54) LOAD CONTROL MODULE THAT PERMITS TESTING OF POWER SWITCHING DEVICES THAT ARE PART OF THE LOAD CONTROL MODULE

(75) Inventors: Michael T. Little, Sheboygan, WI (US); Isaac S. Frampton, Strattanville, PA (US)

(73) Assignee: Kohler Co., Kohler, WI (US)

( * ) Notice: Subject to any disclaimer, the term of this patent is extended or adjusted under 35 U.S.C. 154(b) by 169 days.

(21) Appl. No.: 13/289,169

(22) Filed: Nov. 4, 2011

(65) Prior Publication Data
US 2013/0114187 A1    May 9, 2013

(51) Int. Cl.
*H01J 5/00* (2006.01)
*G01R 31/327* (2006.01)

(52) U.S. Cl.
CPC ... *G01R 31/3278* (2013.01); *H01H 2300/018* (2013.01)

(58) Field of Classification Search
CPC .......... H02G 3/088; H02G 3/081; H02G 3/08; H02G 15/06; H02G 15/076; H02G 3/16; H02G 3/10; H02G 3/12; H02G 3/121; H02G 3/125; H02G 3/126; H02G 3/086; H01J 5/20; H05K 5/00; H05K 5/0004; H05K 1/144; H05K 2201/042; H05K 2201/043; H05K 2203/1536; H05K 3/0097; H05K 5/0021; B60R 16/0239; H01R 13/6395; H01R 24/525; H01R 24/78; H01R 25/006; Y10S 248/906; G01R 31/3278; H01H 2300/018

USPC .............. 174/50, 17 R, 58, 60, 64, 63, 559; 439/535; 248/906; 220/4.02; 361/736
See application file for complete search history.

(56) References Cited

U.S. PATENT DOCUMENTS

| | | | |
|---|---|---|---|
| 4,031,406 A | 6/1977 | Leyde et al. | |
| 4,034,233 A | 7/1977 | Leyde | |
| 4,064,485 A | 12/1977 | Leyde | |
| 4,669,030 A * | 5/1987 | Bannister | ...................... 361/736 |
| 5,414,640 A | 5/1995 | Seem | |
| 5,422,517 A | 6/1995 | Verney et al. | |
| 5,604,421 A | 2/1997 | Barnsley | |
| 5,684,710 A | 11/1997 | Ehlers et al. | |
| 5,861,683 A | 1/1999 | Engel et al. | |
| 6,067,483 A * | 5/2000 | Fesmire | .................. G06F 19/00 700/276 |

(Continued)

*Primary Examiner* — Pete Lee
(74) *Attorney, Agent, or Firm* — Schwegman Lundberg & Woessner, P.A.

(57) ABSTRACT

Some embodiments relate to a load control module that includes an enclosure and a plurality of power switching devices within the enclosure. The load control module further includes an interface mounted on an exterior of the enclosure and a switch connected to the interface. The switch is connected to the interface such that the switch selectively activates the interface to permit testing of the power switching devices upon operation of the interface. In some embodiments, the load control module may include a display that provides information relating to whether the interface is activated by the switch. Other embodiments relate to a load control module that includes a generator having a controller which controls operation of the generator and provides commands to the switch to selectively activate the interface to permit testing of the power switching device upon operation of the interface.

14 Claims, 3 Drawing Sheets

(56) References Cited

U.S. PATENT DOCUMENTS

| | | |
|---|---|---|
| 6,172,428 B1 * | 1/2001 | Jordan .................. 290/40 C |
| 6,172,432 B1 | 1/2001 | Schnackenberg et al. |
| 6,191,500 B1 | 2/2001 | Toy |
| 6,552,888 B2 | 4/2003 | Weinberger |
| 6,739,145 B2 | 5/2004 | Bhatnagar |
| 6,747,368 B2 | 6/2004 | Jarrett, Jr. |
| 6,798,187 B1 | 9/2004 | Czarnecki |
| 6,801,019 B2 | 10/2004 | Haydock et al. |
| 6,833,694 B2 | 12/2004 | Ikekame |
| 6,876,103 B2 | 4/2005 | Radusewicz |
| 6,912,889 B2 | 7/2005 | Staphanos et al. |
| 6,983,640 B1 | 1/2006 | Staphanos et al. |
| 7,015,599 B2 | 3/2006 | Gull |
| 7,053,497 B2 | 5/2006 | Sodemann et al. |
| 7,133,787 B2 | 11/2006 | Mizumaki |
| 7,142,950 B2 * | 11/2006 | Rasmussen et al. ......... 700/286 |
| 7,146,256 B2 | 12/2006 | Hibi et al. |
| 7,149,605 B2 | 12/2006 | Chassin et al. |
| 7,177,612 B2 | 2/2007 | Nakamura et al. |
| 7,177,728 B2 | 2/2007 | Gardner |
| 7,208,850 B2 | 4/2007 | Turner |
| 7,218,998 B1 | 5/2007 | Neale |
| 7,239,045 B2 | 7/2007 | Lathrop |
| 7,245,036 B2 | 7/2007 | Endou et al. |
| 7,274,974 B2 | 9/2007 | Brown |
| 7,336,003 B2 | 2/2008 | Lathrop et al. |
| 7,356,384 B2 | 4/2008 | Gull et al. |
| 7,446,425 B2 | 11/2008 | Sato |
| 7,579,712 B2 | 8/2009 | Yanagihashi et al. |
| 7,582,986 B2 | 9/2009 | Folkers et al. |
| 7,608,948 B2 | 10/2009 | Nearhoof et al. |
| 7,715,951 B2 | 5/2010 | Forbes, Jr. et al. |
| 7,737,360 B2 * | 6/2010 | Wiemeyer ............. H04Q 1/035 174/481 |
| 7,747,355 B2 | 6/2010 | Bulthaup et al. |
| 7,767,905 B2 * | 8/2010 | Meyer .................. H02G 3/086 174/135 |
| 7,778,737 B2 | 8/2010 | Rossi et al. |
| 7,795,851 B2 | 9/2010 | Ye et al. |
| 7,960,869 B2 * | 6/2011 | King, Jr. ............. H02J 13/0062 307/140 |
| 7,968,806 B2 * | 6/2011 | Shelton et al. ............. 174/520 |
| 8,035,029 B2 * | 10/2011 | Mullen .................. H02G 3/088 174/50 |
| 2003/0075982 A1 * | 4/2003 | Seefeldt ........................ 307/29 |
| 2003/0107349 A1 | 6/2003 | Haydock et al. |
| 2004/0012393 A1 * | 1/2004 | Schmalz ............. G01R 31/3277 324/424 |
| 2004/0051515 A1 | 3/2004 | Ikekame |
| 2004/0075343 A1 | 4/2004 | Wareham et al. |
| 2005/0059373 A1 | 3/2005 | Nakamura et al. |
| 2005/0063117 A1 | 3/2005 | Amano et al. |
| 2005/0072220 A1 | 4/2005 | Staphanos et al. |
| 2005/0116814 A1 | 6/2005 | Rodgers et al. |
| 2005/0128659 A1 | 6/2005 | Hibi et al. |
| 2005/0188745 A1 | 9/2005 | Staphanos et al. |
| 2005/0216131 A1 | 9/2005 | Sodemann et al. |
| 2006/0203814 A1 | 9/2006 | Ye et al. |
| 2006/0284843 A1 | 12/2006 | Endou et al. |
| 2007/0010916 A1 | 1/2007 | Rodgers et al. |
| 2007/0120538 A1 | 5/2007 | Sato |
| 2007/0129851 A1 | 6/2007 | Rossi et al. |
| 2007/0222294 A1 | 9/2007 | Tsukida et al. |
| 2007/0222295 A1 | 9/2007 | Wareham |
| 2008/0204947 A1 * | 8/2008 | Shea .................. H01H 83/04 361/3 |
| 2009/0179498 A1 | 7/2009 | Lathrop et al. |
| 2009/0216386 A1 | 8/2009 | Wedel |
| 2009/0290270 A1 | 11/2009 | Ganev et al. |
| 2010/0019574 A1 | 1/2010 | Baldassarre et al. |
| 2010/0038966 A1 | 2/2010 | Espeut, Jr. |
| 2010/0070100 A1 * | 3/2010 | Finlinson et al. ........... 700/295 |
| 2010/0094475 A1 | 4/2010 | Masters et al. |
| 2010/0225167 A1 | 9/2010 | Stair et al. |
| 2010/0250016 A1 * | 9/2010 | Sasaki et al. ............... 700/295 |
| 2011/0109291 A1 | 5/2011 | Tang et al. |
| 2011/0172966 A1 * | 7/2011 | Albsmeier et al. ......... 702/183 |

* cited by examiner

LOAD CONTROL MODULE THAT PERMITS TESTING OF POWER SWITCHING DEVICES THAT ARE PART OF THE LOAD CONTROL MODULE

TECHNICAL FIELD

Embodiments pertain to a load control module, and more particularly to a load control module that permits testing of power switching devices that are part of the load control module.

BACKGROUND

Most conventional load control modules include a test button that permits power switching devices (e.g., relays) located within the load control module to be exercised (i.e., functionally operated) upon operation of the push button.

One of the drawbacks with existing load control modules is such test buttons are located within an enclosure that houses the power switching devices. Since the test button is positioned inside the enclosure, the enclosure must be opened in order to operate the push button.

The need to open the enclosure is undesirable because a potentially unskilled user may be exposed to dangerously high voltage. In addition, a tool is commonly required in order to open the enclosure and expose the push button.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
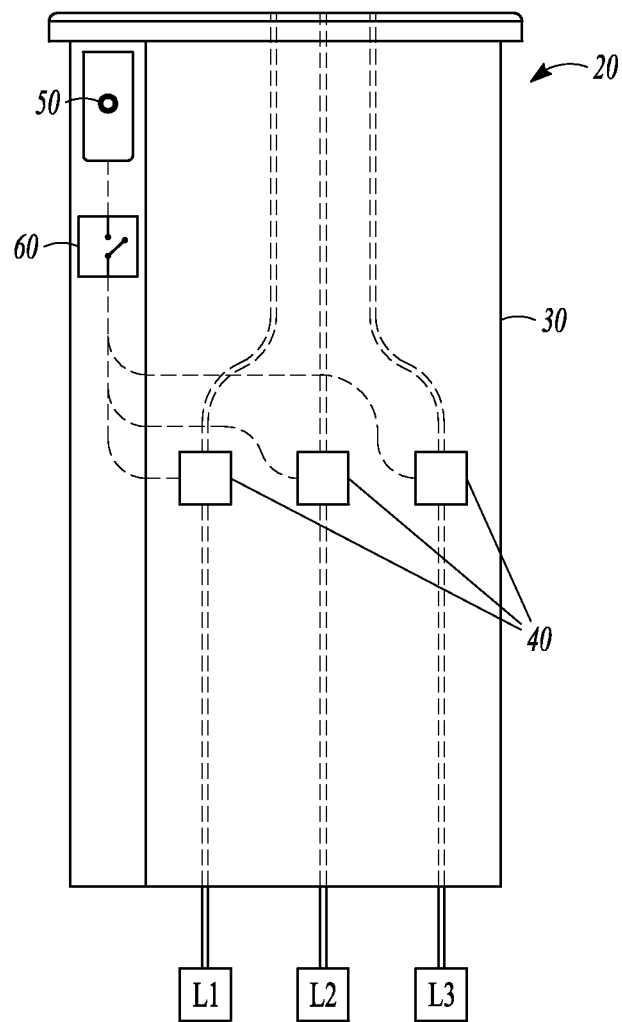
FIG. 1 is a schematic plan view of an example load control module.

FIG. 1 is a schematic plan view of an example load control module 20. The load control module 20 includes an enclosure 30 and a plurality of power switching devices 40 within the enclosure 30. The load control module 20 further includes an interface 50 mounted on an exterior of the enclosure 30 and a switch 60 connected to the interface 50. The switch 60 is connected to the interface 50 such that the switch 60 selectively activates the interface 50 to permit testing of the power switching devices 40 upon operation of the interface 50.

Figure 2:
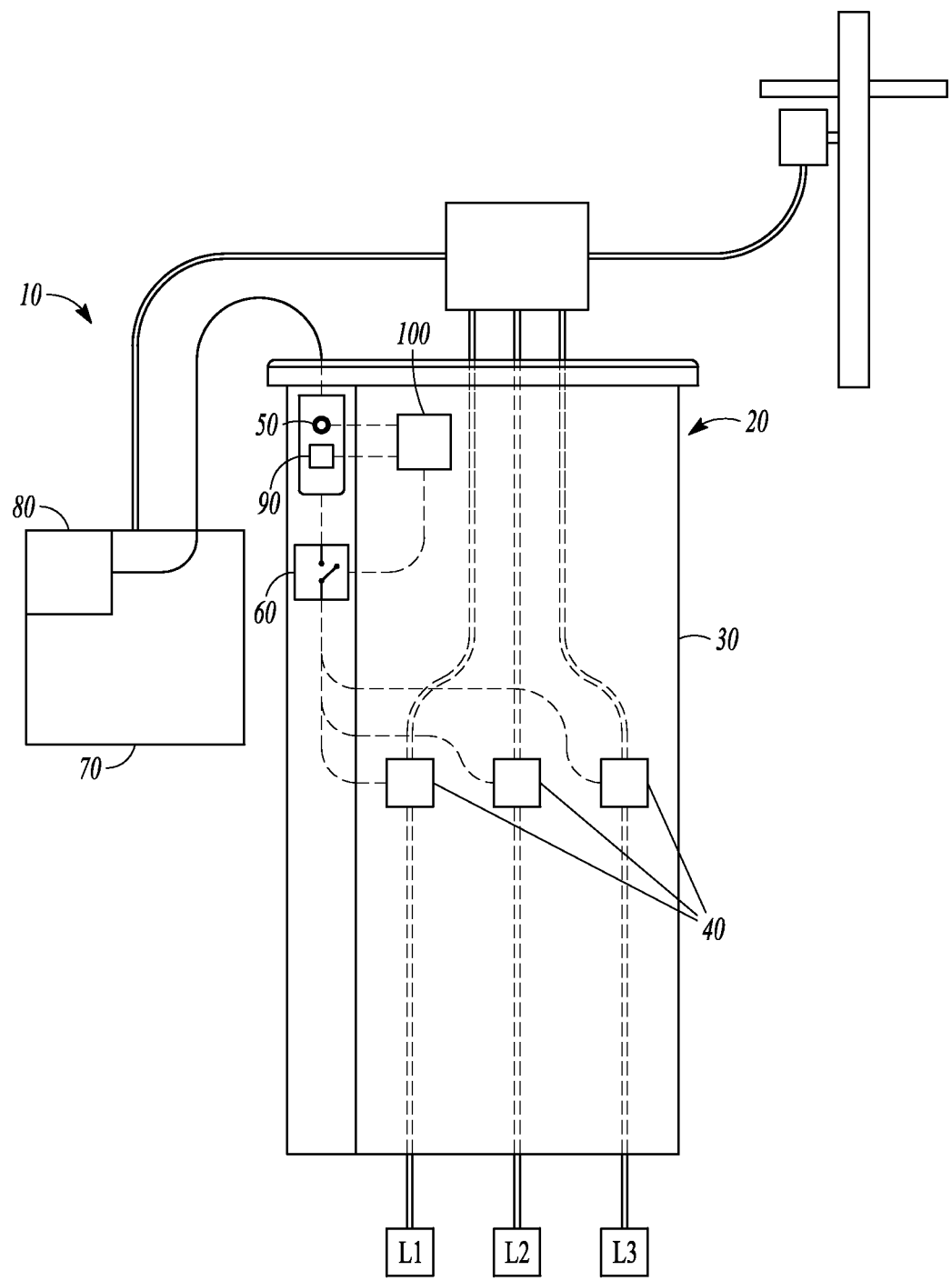
FIG. 2 is a schematic plan view of an example power management system that includes the load control module shown in FIG. 1.
Figure 3:
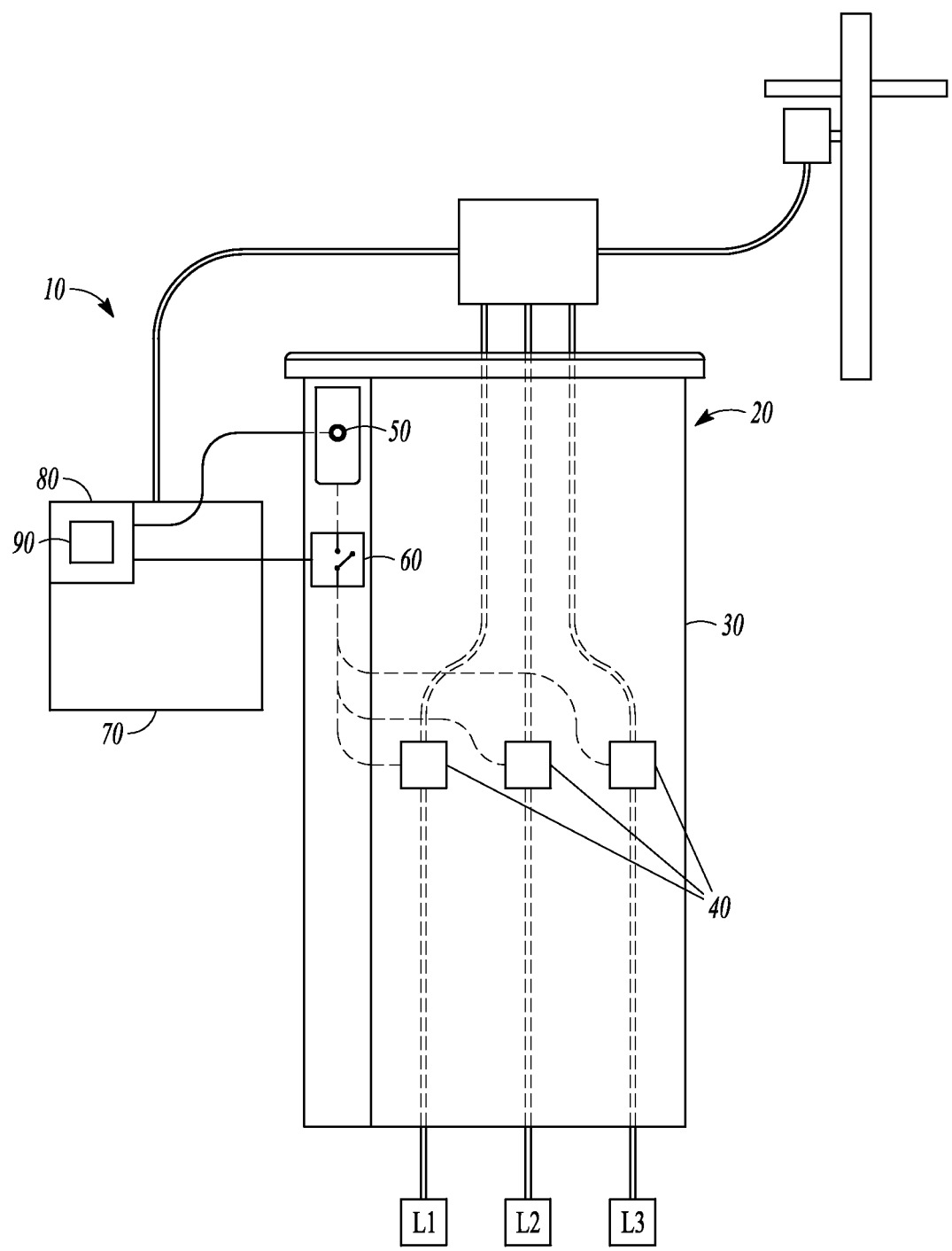
FIG. 3 is a schematic section plan view of another example power management system.

In the example embodiment illustrated in FIGS. 1-3, the interface 50 includes a push button. In other embodiments, the interface 50 may be a touch screen. The type of interface 50 that is included in the load control module 20 will depend in part on (i) the environment where the load control module 20 is to be located; and/or (ii) the type of power switching devices 40 that are included in the enclosure (among other factors).

In some embodiments, each of the power switching devices 40 is a relay, although it is contemplated that that other types of power switching devices may be utilized in the load control module 20. It should be noted that the switch 60 may selectively activate the interface 50 to permit sequential testing of each relay 40 upon operation of the interface 50.

In the example embodiment that is illustrated in FIG. 2, the load control module 20 further includes a display 90 that provides information relating to whether the interface 50 is activated by the switch 60. As an example, the display 90 may be positioned near the interface 50 to provide information to the operator of the interface 50 relating to whether the power switching may be tested at a particular point in time by operating the interface 50.

FIG. 2 is a schematic plan view of an example power management system 10 that includes the load control module 20 shown in FIG. 1. The power management system 10 further includes a generator 70 that includes a controller 80 which controls operation of the generator 70 and provides commands to the switch 60 to selectively activate the interface 50 to permit testing of the power switching device 40 upon operation of the interface 50.

It should be noted the commands for the switch to selectively activate the interface 50 to permit testing of the power switching device 40 may be in other locations besides the generator control 80. As an example, a switch control 100 may be located within the enclosure 30.

During operation of some embodiments of the power management system 10, the generator may need to be in a "run" condition in order for any of the controls described herein to generate commands relating to selective switch activation. As an example, the switch 60 may be activated in order to permit a qualified user to test (i.e., exercise) the power switching devices 40 without opening the enclosure 30 by using the interface 50 on the outside of the enclosure 30.

In the example embodiment that is illustrated in FIGS. 2 and 3, the power management system 10 further includes a display 90 that provides information relating to whether the interface 50 is activated by the switch 60. FIG. 2 shows an example embodiment where the display 90 is positioned near the interface 50. FIG. 3 shows an example embodiment where the display 90 is positioned near the controller 80 near the generator 70.

The example load control modules 20 and power management systems 10 described herein may serve to prevent a potentially unskilled user from being exposed to dangerously high voltage when power switching devices 40 within an enclosure 30 need to be tested.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A load control module comprising: an enclosure; a power switching device within the enclosure; user interactive device comprising an interface configured to be operated by a user, the interface being connected to the power switching device and mounted on an exterior of the enclosure and wherein the interface comprises at least one of a push button or a touch screen; wherein the exterior is an outermost surface of the enclosure; a switch connected to the user interactive device such that the switch selectively activates the user interactive device; wherein the user interactive device is configured to test the power switching device by exercising the power switching device through functionally operating of the power switching device in response to operation of the user interactive device when the user interactive device is activated by the switch; and a generator controller mounted on a generator, wherein the generator controller provides commands to the switch to selectively activate the at least one of the push button or the touch screen to permit testing of the power switching device upon operation of the at least one of the push button or the touch screen.

2. The load control module of claim 1, further comprising a display that provides information relating to whether the user interactive device is activated by the switch.

3. The load control module of claim 1, wherein the display is positioned near the user interactive device.

4. The load control module of claim 1, wherein the power switching device is a relay.

5. The load control module of claim 1, further comprising a plurality of power switching devices within the enclosure, wherein the switch is connected to the at least one of the push button or the touch screen such that the switch activates the at least one of the push button or the touch screen to permit testing of the plurality of power switching devices upon operation of the at least one of the push button or the touch screen.

6. The load control module of claim 5, wherein the user interactive device performs sequential testing each power switching device upon operation of the at least one of the push button or the touch screen.

7. A power management system comprising: an enclosure; a plurality of power switching devices within the enclosure; a user interactive device mounted on an exterior of the enclosure, wherein the user interactive device comprises at least one of a push button or a touch screen wherein the exterior is an outermost surface of the enclosure; a switch connected to the at least one of the push button or the touch screen; a generator controller mounted on a generator that provides commands to the switch to activate the at least one of the push button or the touch screen; and wherein the at least one of the push button or the touch screen is connected to the plurality of power switching device, the at least one of the push button or the touch screen being configured to test the plurality of power switching devices by exercising the plurality of power switching devices through functionally operating the plurality of power switching devices when the at least one of the push button or the touch screen is selectively activated by the switch and wherein the switch is connected to the at least one of the Push button or the touch screen such that the switch activates the at least one of the push button or the touch screen to permit testing of the plurality of power switching devices upon operation of the at least one of the push button or the touch screen.

8. The power management system of claim 7, further comprising a display that provides information relating to whether the user interactive device is activated by the switch.

9. The power management system of claim 8, wherein the display is positioned near the user interactive device.

10. The power management system of claim 8, wherein the display is positioned near the generator controller.

11. The power management system of claim 7, wherein the plurality of power switching devices are relays.

12. The power management system of claim 7, wherein the switch activates the at least one of the push button or the touch screen to permit sequential testing of each of the plurality of power switching devices upon operation of the at least one of the push button or the touch screen.

13. A power system comprising: an enclosure, a power switching device within the enclosure; at least one of a push button or a touch screen connected with the power switching device and mounted outside of the enclosure; a switch that selectively activates the at least one of the push button or the touch screen; wherein the user interactive device is configured to test the power switching device by exercising the power switching device through functionally operating of the power switching device in response to operation of the user interactive device when the user interactive device is activated by the switch; and a generator controller mounted on a generator, wherein the generator controller provides commands to the switch to selectively activate the at least one of the push button or the touch screen to permit testing of the power switching device upon operation of the at least one of the push button or the touch screen.

14. The power system of claim 13, further comprising a display that provides information relating to whether the at least one of the push button or the touch screen is activated by the switch.

* * * * *